(12) United States Patent
Sunamura

(10) Patent No.: US 8,258,589 B2
(45) Date of Patent: Sep. 4, 2012

(54) SEMICONDUCTOR DEVICE AND METHOD OF MANUFACTURING THE SAME

(75) Inventor: Hiroshi Sunamura, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/929,697

(22) Filed: Feb. 9, 2011

(65) Prior Publication Data

US 2011/0198709 A1      Aug. 18, 2011

Related U.S. Application Data

(60) Provisional application No. 61/305,457, filed on Feb. 17, 2010.

(51) Int. Cl.
*H01L 29/78* (2006.01)
(52) U.S. Cl. .......................... 257/412; 257/410; 257/411
(58) Field of Classification Search .................. 257/411, 257/410, 412
See application file for complete search history.

(56) References Cited

U.S. PATENT DOCUMENTS

| | | | |
|---|---|---|---|
| 6,645,818 B1 | 11/2003 | Sing et al. | |
| 7,964,489 B2 * | 6/2011 | Koyama et al. | 438/591 |
| 2004/0164362 A1 | 8/2004 | Conley, Jr. et al. | |
| 2009/0021424 A1 | 1/2009 | Wahlberg et al. | |

* cited by examiner

*Primary Examiner* — Douglas Menz
(74) *Attorney, Agent, or Firm* — McGinn IP Law Group, PLLC

(57) ABSTRACT

A semiconductor device includes a gate stack structure. The gate stack structure includes an interfacial layer formed on a semiconductor substrate, a high-k dielectric formed on the interfacial layer, a silicide gate including a diffusive material and an impurity metal, and formed over the high-k dielectric, and a barrier metal with a barrier effect to the diffusive material, and formed between the high-k dielectric and the metal gate. The impurity metal has a barrier effect to the diffusive material so that the diffusive material in the silicide gate can be prevented from being introduced into the high-k dielectric.

11 Claims, 1 Drawing Sheet

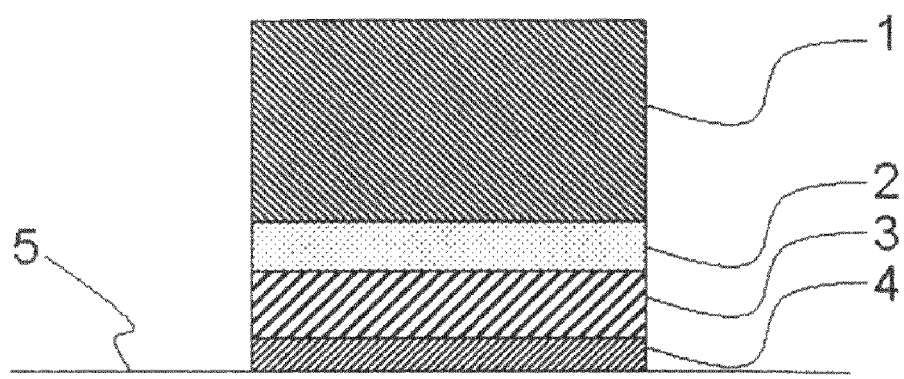

SEMICONDUCTOR DEVICE AND METHOD OF MANUFACTURING THE SAME

The present Application is a Nonprovisional Application of Provisional U.S. Patent Application No. 61/305,457, filed on Feb. 17, 2010, incorporated herein by reference.

BACKGROUND OF THE INVENTION

1. Field of the Invention

This invention relates to a semiconductor device, in particular, to a semiconductor device including a metal/high-k gate structure.

2. Description of Related Art

In metal gate/high-k (MG/HK) technology, work-function control is a key to adjusting Vth (threshold voltage) of the transistors. FUSI, or fully silicided, metal gate is one of the MG/HK solutions to control the work-function.

SUMMARY

The inventors have realized the problems as below.

The fully silicided metal gate contains diffusive materials (like Ni), which react with silicon to form silicides. The diffusive materials can diffuse into the HK/interfacial oxide and the substrate, which in turn can deteriorate the device performance. These diffusive materials can form a leak spot in the HK/interfacial oxide and their reliability can be degraded. The diffusive materials also can increase charge traps, which cause hysteresis in the transistor characteristics and degrade mobility.

In order to prevent such problems, it is known to use high-k dielectrics (HKs) that are resistant to the material diffusion. However, it limits the selection of the high-k dielectrics (HKs) and also the scaling of the thickness of the high-k dielectrics (HKs) because certain HK thickness will be required to suppress the diffusion.

Alternatively, it is known to provide a barrier layer between a high-k dielectric and a metal gate. For example, U.S. Patent publication No. 2004/0164362 discloses a metal gate including Nickel and a barrier layer including Titanium or Tantalum. U.S. Patent publication 2009/021424 and U.S. Pat. No. 6,645,818 also discloses a metal gate and a barrier layer. However, those solutions are required to provide the barrier layer having a thick thickness to effectively prevent a metal constituent in the metal gate from diffusing into the high-k dielectric. Introduction of the thick barrier metal unwillingly induces a change in the work-function of the transistor. Such negative influence should be avoided. It is noted that those related arts fail to teach or suggest using a silicide as the metal gate in the first place.

A semiconductor device of an exemplary aspect of the present invention includes a gate stack structure. The gate stack structure includes a interfacial layer formed on a semiconductor substrate, a high-k dielectric formed on the interfacial layer, a metal gate including a silicide including a diffusive material and an impurity metal, formed over the high-k dielectric, and a barrier metal with a barrier effect to the diffusive material, and formed between the high-k dielectric and the metal gate. The impurity metal has a barrier effect to the diffusive material. The impurity metal may be mainly placed at a boundary between the barrier metal and the metal gate.

The impurity metal, in particular, mostly locally located at the boundary between the barrier metal and the metal gate, functions as an additional barrier layer which prevents the diffusive material in the metal gate from diffusing into the high-k dielectric. The exemplary aspect thus allows the original barrier metal to be thinner than the thickness of the barrier metal in the related arts. Therefore, the exemplary aspect can obtain the work-function of the metal gate effectively because the thin original barrier metal reduces the effect of the work-function of the original barrier metal. Additionally, the impurity metal can also modify the work-function of the metal gate in a favorable way.

Moreover, the exemplary aspect can effectively suppress diffusion of materials in FUSI into the high-k dielectric. Therefore, the exemplary aspect can avoid device performance degradation induced by diffused materials into HK/interfacial oxide and substrate (such as leakage enhancement, reliability degradation, mobility degradation and hysteresis) in the scaled devices.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 1 illustrates a cross-sectional view showing a semiconductor device of an exemplary embodiment according to the present invention.

DETAILED DESCRIPTION OF THE EXEMPLARY EMBODIMENTS

FIG. 1 shows a cross-sectional view showing a semiconductor device of an exemplary embodiment according to the present invention.

As shown in FIG. 1, a semiconductor device includes a interfacial layer 4 formed on a semiconductor substrate 5, a high-k dielectric 3, a barrier metal 2 with a barrier effect to a diffusive material, and a metal gate 1 including the diffusive material and an impurity metal, which constitute a gate stack structure.

The metal gate 1 is provided with a silicide such as nickel (Ni) silicide, platinum (Pt) silicide, and cobalt (Co) silicide. The diffusive material can be a material which constitutes the silicide, such as Ni, Pt, or Co. The impurity metal in the metal gate can be platinum (Pt) or aluminum (Al). The impurity metal is locally located adjacent to the barrier metal 2 so that the impurity metal is mainly placed at the boundary between the barrier metal 2 and the metal gate 1. The impurity metal can also be present in the metal gate but important thing is that there is a pile-up of the impurity at the barrier metal boundary. A layer made by impurity metal locally located functions as an additional barrier metal layer which also prevents the diffusive material in the metal gate from diffusing into the high-k dielectric 3. The barrier metal 2 can be a titanium nitride (TiN) or a tantalum nitride (TaN). The high-k dielectric 3 can be any hafnium (Hf) based, Zerconium (Zr) based or any known high-k.

By inserting the barrier metal 2 with the barrier effect to the diffusive material between the metal gate 1 and the high-k dielectric 3, the diffusion of the diffusive material in the metal gate 1 to the high-k dielectric 3 can be suppressed. The barrier metal 2 is initially effective in preventing the diffusion of the diffusive material in the metal gate 1. Furthermore, the impurity metal incorporated in the metal gate 1 would have a concentration at a lower portion adjacent to the barrier metal 2 higher than the other portion of the metal gate 1. The impurity metal is also functional in preventing the diffusion of the diffusive material in the metal gate 1 into the high-k dielectric 3 as well as in controlling work-function. Therefore, the thickness of the barrier metal 2 can be made thinner, compared to the related arts, because the impurity material in the metal gate 1 also acts as a diffusion barrier to the diffusive material in the metal gate 1.

In sum, inclusion of the impurity is effective in reducing the thickness of the barrier metal 2. The reduction of the thickness of the barrier metal 2 allows work-function of the metal gate 1 to become more dominant, and reduce the unnecessary influence for the work-function of the transistor. This allows controlling of the work-function irrespective of the materials used in the barrier metal 2.

Using the gate stack of the present invention allows continued thinning of the high-k dielectric 3 for scaled generations because the barrier effect is provided by the metal layers. Using the gate stack of the present invention also expands the selection of high-k dielectrics.

When the impurity metal such Pt and Al is mixed to Nickel silicide, the impurity metal is piled up at the boundary between the barrier metal 2 and the metal gate 1 or at an upper portion of the barrier metal 2. Therefore, an additional barrier metal layer constituted by the impurity metal is provided at the upper portion of the barrier metal 2. When Al is used, none of Al almost remains in the Ni silicide and Al concentrates at the boundary between the barrier metal 2 and the metal gate 1. When Pt is used, Pt distributes in the Ni silicide. However, Pt distributes to have the highest peak concentration at a region adjacent to the boundary between the barrier metal 2 and the metal gate 1.

It should be noted that the present invention is not limited only to the above described exemplary embodiments, and of course, various changes can be made within the scope not deviating from the gist of the present invention.

Further, it is noted that Applicant's intent is to encompass equivalents of all claim elements, even if amended later during prosecution.

What is claimed is:

1. A semiconductor device including a gate stack structure, the gate stack structure comprising:
   an interfacial layer formed on a semiconductor substrate;
   a high-k dielectric formed on the interfacial layer;
   a silicide gate including a diffusive material and an impurity metal, and formed over the high-k dielectric; and
   a barrier metal with a barrier effect to the diffusive material, and formed between the high-k dielectric and the metal gate, wherein the impurity metal has a barrier effect to the diffusive material so that the diffusive material in the silicide gate can be prevented from being introduced into the high-k dielectric,
   wherein said barrier metal comprises a titanium nitride (TiN) or a tantalum nitride (TaN).

2. The semiconductor device, as claimed in claim 1, wherein the impurity material is locally located so that a peak of the concentration of the impurity metal is located at a boundary between the barrier metal and the silicide gate.

3. The semiconductor device, as claimed in claim 1, wherein the high-k dielectric includes a Hf-based high-k dielectric or Zr-based high-k dielectric.

4. The semiconductor device, as claimed in claim 1, wherein the barrier metal has a thickness of 3 nm or less.

5. The semiconductor device, as claimed in claim 4, wherein the thickness of the barrier metal is 1.5 nm or less.

6. The semiconductor device, as claimed in claim 1, wherein the diffusive material includes Ni.

7. The semiconductor device, as claimed in claim 1, wherein the impurity metal comprises Pt or Al.

8. The semiconductor device, as claimed in claim 1, wherein the impurity metal is locally located so that a peak of the concentration of the impurity metal is located at an upper portion of the barrier metal.

9. The semiconductor device, as claimed in claim 8, further comprising an additional metal barrier layer comprising the impurity metal provided at the upper portion of the barrier metal.

10. The semiconductor device, as claimed in claim 1, wherein the diffusive material comprises Pt.

11. The semiconductor device, as claimed in claim 1, wherein the diffusive material comprises Co.

* * * * *